United States Patent Office

3,825,430
Patented July 23, 1974

3,825,430

LIGHT-SENSITIVE COMPOSITION AND METHOD

Kurt A. Kurka, Shoreview, Minn., assignor to Minnesota Mining and Manufacturing Company, St. Paul, Minn.

No Drawing. Filed Feb. 9, 1972, Ser. No. 224,930
Int. Cl. G03c *1/68*
U.S. Cl. 96—115 R 14 Claims

ABSTRACT OF THE DISCLOSURE

Light-sensitive compositions are provided wherein a continuous phase comprises a light-sensitive organic material while a discontinuous phase comprises finely divided, rubbery, elastomeric, organic compound. The compositions can be cured to an insoluble, heat-resistant, flexible state. A method for covering or protecting printed circuitry using such compositions is also provided.

BACKGROUND OF THE INVENTION

This invention relates to light-sensitive compositions and, more particularly, to light-sensitive compositions useful as protective coverings on printed circuitry.

In the electronics field where printed circuit boards are used extensively, it is quite often desirable, and many times necessary, to protect such printed circuit boards from moisture and atmospheric pollutants during use and also from possible damage during assembly, storage, shipment and use. Simple thermoplastic and thermosetting coatings, as well as conventional adhesive films, have been used previously for this purpose. Such coatings are also used to form a dielectric barrier over the circuit so as to increase the reliability and lengthen the useful life of the printed circuit.

However, there are many disadvantages attendant with such films. For example, when such prior art coatings are used in dry film form, holes must be preformed in the dry film to correspond to those areas on the circuit board to which other electrical components are to be solder-connected. Registration problems are inherent in such an approach. Moreover, when such dry films are thermoplastic in nature, they are easily deformed when contacted with molten solder. When thermosetting coatings are used, the heating which is necessary for curing the coating may distort the printed circuit board or cause shrinkage thereof.

Furthermore, covering printed circuit boards with such prior art coatings is very time consuming and costly because of the need for preforming holes, registering coatings and circuit boards, etc. Consequently, such prior art coatings and films have been of limited utility in large volume, automated industries.

Other properties which protective coatings must possess in order to be practical for automated assembly operations and final use include insolubility, heat-resistance, and flexibility. Insolubility and solvent resistance are necessary properties of the protective coating because boiling cleaning solvents (e.g., trichloroethylene) are often used in assembly operations to remove solder flux and solder reflow oils. Heat-resistant coatings are required because later-attached electronic components are soldered in place by subjecting an entire surface of the circuit board to molten solder at 450–550° F. (230–290° C.). The protective coating must also be flexible and nonbrittle so that it will conform to the surface of the circuit board and withstand flexing and other distortion without cracking or chipping and without coming loose from the circuit board under various assembly conditions and in final use.

Protective coatings employing conventional photosensitive compositions do permit selective removal of portions of the coating so that electrical components may be connected to the circuit board, but such protective coatings do not exhibit the solvent-resistance, heat-resistance, and flexibility needed for an acceptable protective coating of the type described herein. Attempts to impart flexibility to such conventional photosensitive compositions by adding flexibilizers such as plasticizers, soluble rubber compounds, etc. thereto have been unacceptable because the flexibilizers must be used at such high levels that other necessary and desirable properties of the final coating (e.g., solvent-resistance and heat-resistance) are lost.

SUMMARY OF THE INVENTION

In accordance with the invention there is provided a light-sensitive composition comprising (a) a continuous phase comprising light-sensitive, organic material, and (b) a discontinuous phase comprising at least one finely divided, elastomeric compound uniformly distributed throughout the continuous phase.

The light-sensitive organic material may be of the photocrosslinkable type (negative acting) or of the photosolubilizable type (positive acting). Solvent development of image-wise exposed composition removes the composition from nonimage areas, in the case of photocrosslinkable compositions, or from image areas, in the case of photosolubilizable compositions. Monomers may also be included in the negative-acting compositions to increase the crosslink density in the final coating. The rubbery, elastomeric, organic compound, existing as a discontinuous phase throughout the organic material, imparts flexibility and conformability to the final crosslinked coating. The crosslinked coatings of the compositions of this invention are quite solvent resistant and heat resistant, and they are also quite effective dielectric barriers. Consequently, the novel light-sensitive compositions have particular utility as protective coatings for printed circuitry.

DETAILED DESCRIPTION OF THE INVENTION

The light-sensitive, organic materials which are useful in the compositions of this invention include photocrosslinkable compositions and photosolubilizable compositions. The useful photocrosslinkable compounds are those compounds containing reactive groups (preferably pendant groups) which cause crosslinking of the compounds in the presence of free radicals. Representative of such reactive groups are (a) those containing ethylenic unsaturation, e.g., allyl esters (e.g., as described in U.S. 3,376,-138), cinnamoyl groups (e.g., as described in U.S. 1,973,-493), acrylates and stilbene groups (b) those containing azido groups (e.g., as described in U.S. 2,948,610) and (c) those containing chalcone groups (e.g., as described in Belgian Pat. 675,490). The preferred reactive crosslinking groups are those containing ethylenic unsaturation.

These photocrosslinkable compounds generally have one reactive crosslinkable group (i.e., one crosslink site) for each 100 to 2500 molecular weight units of the compound. Preferably, there is one crosslink site per 200 to 1000 molecular weight units of compound.

One class of preferred photocrosslinkable compounds has the following structure:

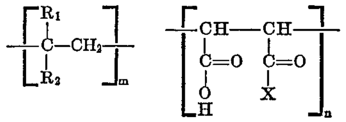

where $R_1$ is hydrogen or $CH_3$; $R_2$ is selected from the group consisting of hydrogen, alkyl radicals having 1 to 18 carbon atoms, aryl radicals and substituted aryl radicals (e.g., phenyl, substituted phenyl, naphthyl, substituted naphthyl); wherein X is a photocrosslinkable moiety; wherein the ratio $n:m$ is in the range of 1:1 to 1:10, and wherein the molecular weight of said photocrosslinkable polymer is in the range of about 750 to 50,000.

The photocrosslinkable moiety X is preferably an organic group having ethylenic unsaturation, although other crosslinkable moieties such as azido groups (e.g., sulfonylazidobenzoyl) and chalcone groups are also useful. Illustrative of X moieties are allyl groups, cinnamoyl groups, 2-hydroxyalkylacrylyl, $$-O-(CHR_4)_a-O-\underset{O}{\underset{\|}{C}}-\underset{R_3}{\underset{|}{C}}=CH_2,$$

$$-O-(CHR_4)_a-NH-\underset{O}{\underset{\|}{C}}-\underset{R_3}{\underset{|}{C}}-CH_2, \text{ and } -NH-(CHR_4)_a-O-\underset{O}{\underset{\|}{C}}-\underset{R_3}{\underset{|}{C}}=CH_2,$$

where $a$ is 2 to 4, $R_3$ is hydrogen or methyl, and $R_4$ is hydrogen, hydroxy, or amino.

Another useful class of photocrosslinkable compounds are phenol/formaldehyde copolymers containing pendant photocrosslinkable groups. An illustrative structure for this class of compounds is as follows:

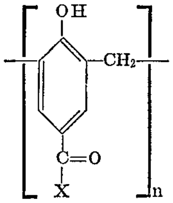

where $n$ is an integer of 3 to 10 and X is a photocrosslinkable moiety as defined above.

A class of preferred photocrosslinkable compounds which are of the nonacid type have the following structure:

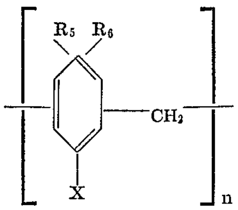

where $n$ is an integer of 3 to 10 and X is a photocrosslinkable moiety as defined above, and $R_5$ and $R_6$ are hydrogen or lower alkyl radicals.

The photocrosslinkable compounds described herein become crosslinked in the presence of free radicals. Application of heat to the composition during exposure thereof to actinic radication is not required in order to obtain a highly crosslinked, solvent-resistant, heat-resistant structure.

When the photocrosslinkable compound has azido groups as the reactive crosslinkable groups, it is not necessary to include a separate photoinitiator system therewith in order to obtain a highly light-sensitive composition. Rather, upon exposure of such compounds to actinic radiation, the azido groups generate free radicals which cause crosslinking of the compounds. However, when using photocrosslinkable compounds which have only ethylenically unsaturated reactive groups or chalcone reactive groups, it is necessary to include therewith a photoinitiator system which is normally nonreactive in the composition but which, upon absorption of actinic radiation, is capable of generating free radicals.

In order to increase the crosslink density of crosslinked coatings made in accordance with this invention, one may also include in the photocrosslinkable composition one or more polyfunctional photocrosslinkable monomers. Such monomers have at least two groups which are reactive with free radicals. In the presence of free radicals these monomers react with themselves and with the photocrosslinkable polymer compounds to form a highly crosslinked network. The preferred reactive monomers have at least two sites of ethylenic unsaturation, e.g., diacrylates, dimethacrylates, triacrylates, trimethacrylates, etc. Preferred reactive monomers include diallyl phthalate, triallyl isocyanurate, neopentylglycol diacrylate or dimethacrylate, trimethylolpropane triacrylate or trimethacrylate, pentaerythritol tetraacrylate, or tetramethacrylate, and bisphenol A diacrylate or dimethacrylate. Such monomers are generally used in amounts of about 10 to 200 weight percent or even higher based on the weight of the photocrosslinkable polymeric compound.

Typical useful photosolubilizable compounds which can be used in the practice of this invention include the diazo quinone compositions described, e.g., in U.S. 3,046,112; U.S. 3,046,118; U.S. 3,046,119; U.S. 3,046,121; and U.S. 3,046,124, although the preferred photosolubilizable compounds are those described in copending application Ser. No. 224,918, now Pat. No. 3,779,778, incorporated herein by reference. Such photosolubilizable compounds contain one or more acid-degradable groups of the formula

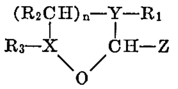

where $n$ is zero, 1, 2, or 3; and wherein when $n$ is zero, X and Y are $-CH_2-$ and $R_1$ is hydrogen or lower alkyl; and when $n$ is 1, 2, or 3, X and Y are $-CH-$, $R_1$ is hydrogen, $R_2$ is hydrogen or lower alkyl; and wherein $R_3$ is hydrogen, a monovalent aliphatic radical, or a divalent organic radical; and Z is selected from the group consisting of $-OAr$, $-NRSO_2Ar$,

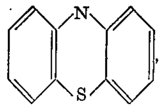
, and
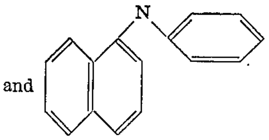

where Ar is a monovalent or divalent aromatic group and R is a lower alkyl group.

These photosolubilizable compounds may be formally prepared by the nucleophilic addition reaction of (1) organic compounds containing one or more alkyl vinyl ether groups with (2) organic compounds containing one or more aromatic hydroxyl groups, aromatic monoalkylsulfonamide groups (i.e., $-RNHSO_2Ar$, where R is lower alkyl (i.e., containing less than about four carbon atoms) and Ar is an aromatic group), or the secondary aromatic amines phenothiazine or α-naphthyl phenyl amine.

Suitable compounds containing one alkyl vinyl ether group include the alkyl vinyl ethers (e.g., methyl vinyl ether, ethyl vinyl ether, isobutyl vinyl ether, and the like) and the dihydropyrans (e.g., dihydropyran, 2-methyl-2H-3,4-dihydropyran, 4-ethyl-2H-3,4-dihydropyran, 4-phenyl-2H-3,4-dihydropyran and the like). Examples of compounds containing more than one alkyl vinyl ether group that are useful in preparing the acid-degradable compounds include the vinyl ethers of polyhydric alcohols (e.g., ethylene glycol divinyl ether, glycerol trivinyl ether, butanediol divinyl ether, hexanediol divinyl ether, pentaerythritol tetravinyl ether) and the divinyl ethers of polyalkylene glycols. Preferred compounds containing more than one vinyl ether group useful in the preparation of the acid-degradable materials include bisdihydropyran derivatives.

Suitable compounds containing one or more aromatic hydroxyl groups useful in the preparation of the acid-degradable materials are phenols and polyhydric phenols. Useful aromatic monoalkylsulfonamide compounds include, among others, N-methylbenzenesulfonamide,
N-phenylbenzenesulfonamide,
N-2-dimethylbenzenesulfonamide,
N-methyl-2-trifluoromethylbenzenesulfonamide,
N,2,4-trimethylbenzenesulfonamide,
N,N'-dimethyl-1,4-benzenedisulfonamide,
N,N'-dimethyl-1,2-benzenedisulfonamide,
N,N'-dimethyl, bis-[4-(N-methylsulfonamido)phenyl] methane, and
4,4'-bis(N-methylsulfonamido)diphenyl.

When photosolubilizable compounds are used in the light-sensitive compositions of the invention there must also be included therewith at least one thermally-crosslinkable binder. The binder should be present in an amount such that the composition, upon being heated or cured (e.g., at 125–150° C. or more), becomes crosslinked to an insoluble, heat-resistant state. The preferred photosolubilizable compositions described herein generally crosslink when briefly heated at about 150° C. although some of these compositions may require brief heating at about 250° C. for extensive crosslinking.

Suitable thermally-crosslinkable binders are those which are normally soluble in common organic solvent and generally include the phenol/formaldehyde resins. The preferred binders are the phenol/formaldehyde novolak resins. These resins are described in Schildknecht, *High Polymers*, Vol. X, page 300 et seq., Interscience Publishers Inc., New York (1956).

The thermally-crosslinkable binder is generally used in amounts of about 20 to 80 weight percent based on the total weight of the composition. Mixtures of thermally-crosslinkable binders may be used as long as the binder mixture is soluble in a particular developing solution.

In each of the light-sensitive compositions of this invention, there is at least one finely divided, rubbery or elastomeric organic compound uniformly distributed throughout the continuous phase of the light-sensitive organic material. The elastomeric compounds which are suitable are those which exist as a discontinuous phase in the composition, i.e., those elastomeric compounds which are sufficiently incompatible with the continuous phase of light-sensitive material to form a dispersion of small rubbery islands or particles throughout the continuous phase. The term "elastomer" is defined in ASTM Special Technical Publication No. 184 (1956) as a substance which can be stretched at room temperature to at least twice its original length and, after having been stretched and the stress removed, returned with force to approximately its original length in a short time.

Because this finely divided organic compound is elastomeric in nature (i.e., rubbery and elongatable), it imparts flexibility and toughness to coatings of the light-sensitive compositions. Upon light exposure and crosslinking of the compositions, the elastomeric compound remains rubbery and elastomeric. Consequently, the resulting highly crosslinked coatings also exhibit flexibility. Because the elastomeric compound is present in the composition only as a discontinuous phase, the continuous phase of light-sensitive organic material cures or crosslinks to a solvent-resistant state.

The elastomeric compound exists in the discontinuous phase in the form of irregularly shaped rubbery islands uniformly dispersed throughout the continuous phase. Although the size distribution of the elastomeric particles may vary greatly in the composition (e.g., from less than one micron to 3,000 microns), the majority of such particles have an average diameter of about 25 to about 250 microns.

The amount of rubbery, elastomeric compound employed in the light-sensitive compositions may vary considerably depending upon the degree of solvent-resistance, heat-resistance and flexibility desired in the final crosslinked coating. Generally, however, the amount of rubbery, elastomeric compound used is in the range between about 5% and 50% of the weight of the total composition, with 20–30 weight percent being preferred.

Suitable elastomeric compounds include nitrile rubbers (e.g., butadiene/acrylonitrile copolymer rubbers and butadiene/acrylonitrile/carboxylic acid copolymers); styrene/butadiene block copolymer rubbers, epihalohydrin rubbers (e.g., homopolymers of epichlorohydrin and copolymers of epichlorohydrin and ethylene oxide), polyurethane rubbers (e.g., derived from polyester polyol and polyisocyanate), polyacrylate rubbers (e.g., polyethylacrylate rubber), ethylene/propylene copolymer rubbers, polyisobutylene rubbers, chlorine-containing rubbers, and natural rubbers.

Combinations or mixtures of more than one elastomeric compound may be used in the novel light-sensitive compositions, subject to the following conditions: (a) The elastomeric compounds used must be compatible with each other; and (b) at least one of the elastomeric compounds must be incompatible or insoluble in the light-sensitive compound of the continuous phase. Preferably, the weight of any elastomeric compound which is soluble in the continuous phase is less than the weight of elastomeric compound which is insoluble in the continuous phase (and even more preferably the weight of soluble elastomer is less than 30% of the weight of the insoluble elastomer present).

Photoinitiator systems which are suitable for use in the compositions of this invention include those materials which are normally nonreactive in the composition but which, upon absorption of actinic radiation, are capable of generating free radicals. For example, the vicinial polyketaldonyl compounds described in U.S. 2,367,660, the alpha-carbonyls described in U.S. 2,367,661 and U.S. 2,367,670, the acyloin ethers described in U.S. 2,448,828, the alpha-hydrocarbon substituted aromatic acyloins described in U.S. 2,722,512, the polynuclear quinones described in U.S. 3,046,127 and U.S. 2,951,758, and the triarylimidazolyl dimer/p-aminophenyl ketone combination described in U.S. 3,549,367 are useful photoinitiators. Other suitable photoinitiator systems include the dye-sensitized photolyzable organic halogen compounds described in copending application Ser. No. 720,377, now U.S. Uat. No. 3,640,718, issued Feb. 8, 1972 and in U.S. Patent 3,617,288.

These organic halogen-containing photoinitiator compounds are substantially neutral, i.e., neither acidic nor basic, and in the absence of actinic radiation are chemically inert toward the organic resist material of the continuous phase. In addition they are of sufficiently low vapor pressure to remain in the composition prior to photo.ysis, and are sufficiently stable to avoid undergoing decomposition under all normal storage conditions. On exposure to actinic radiation such as ultraviolet radiation, or visible light when employed in conjunction with suitable sensitizing dyes, these compounds undergoing dissociation at one or more of the carbon-halogen bond should be between about 40 and about 70 kilogram-calories per mole.

The preferred photoinitiator systems comprise the vinyl-substituted halomethyl-s-triazines described in copending application Ser. No. 117,851, filed Sept. 3, 1971, incorporated herein by reference. These photoinitiators are preferred because they induce higher cross-linking rates for the photocrosslinkable polymers than do other photoinitiators, low concentrations of these photoinitiators can be used because of their effectiveness, they are less oxygen inhibited than other photoinitiators, and they do not require the presence of sensitizing dyes.

The photoinitiator system is typically distributed uniformly throughout at least the continuous phase of the light-sensitive material in amounts ranging from about 0.1% to about 5% based on the total weight of the continuous phase material. Preferably the photoinitiator system is used in amounts of about 1–3% based on the weight of the continuous phase. No deleterious effects are noticed if some amount of the photoinitiator system is present in the discontinuous phase, although an effective amount of the photoinitiator must, of course, be present in the continuous phase.

In the preparation of the compositions of the invention, it is most convenient to first dissolve the elastomeric compound in a solvent in which the other ingredients of the composition are also soluble. After the desired amount of elastomer has been so dissolved, the other ingredients (i.e., light-sensitive compound, photoinitiator system, polyfunctional monomer (if desired), colorants, etc.) are also dissolved therein. Because the elastomeric compound is insoluble in, or incompatible with, the remaining ingredients, it is necessary to maintain agitaton of the so-prepared mixture until the mixture is coated onto a suitable support using conventional coating techniques (e.g., knife-coating). It is the insolubility or incompatibility of the elastomeric compound in the light-sensitive material that causes small islands or particles of the elastomeric compound to form in the continuous phase of the light-sensitive compound. Suitable common solvents which are useful in preparing the coating dispersion include ketones (e.g. methyl ethyl ketone), ethers (e.g. tetrahydrofuran), and aromatic hydrocarbons (e.g. toluene) and blends thereof. Typically, the solution of elastomeric compound is made up of about 15–20% solids, and after the remaining coating ingredients have been added thereto, the coating dispersion is about 40% solids.

After the wet light-sensitive composition coating dispersion or mixture has been prepared, it is coated, after agitation, onto a suitable support. For example, it may be coated directly onto a printed circuit board and dried. Preferably, however, the coating mixture is coated onto a thin, flexible substrate or support film (e.g., a plastic film) and dried. Preferred flexible substrates are sufficiently thermoplastic in nature so that they may be deformed by heat and pressure near the softening point of the light-sensitive composition without becoming aggressively tacky. Examples of such thermoplastic substrates or films are polyethylene, polyvinyl alcohol, polyvinyl butyral, polyvinyl formal, polyvinylidene chloride, and cellophane. A particularly preferred substrate or film is polyvinyl alcohol which also has the advantage of being water-soluble. Typically, the thickness of the thermoplastic substrate is in the range of about 0.5 to 5 mils, with 0.7 to 2 mils being preferred. It is usually desirable to expose the light-sensitive composition to actinic radiation before removal of the thermoplastic substrate. Hence, it is often preferred to use thermoplastic substrates which are substantially transparent to actinic radiation.

The light-sensitive composition is generally coated onto the thermoplastic substrate and dried so as to leave a light-sensitive layer having a thickness of about 0.5 to 5 mils. A removable protective liner may then be applied over the light-sensitive layer so as to protect such layer from damage until it is desired to apply the light-sensitive layer to a printed circuit board. Generally, the protective liner is a thin, flexible film (e.g., plastic film) which may have one surface thereof coated with a conventional release agent. This three-layered dry laminate (i.e., thermoplastic substrate/light-sensitive composition layer/protective liner) may be stored indefinitely under ambient conditions.

To cover a printed circuit board, the protective liner is first removed from the light-sensitive layer of the dry laminate. Next, one surface of the light-sensitive layer is placed in contact with the surface of the printed circuit board, the thermoplastic substrate remaining adhered to the opposite surface of the light-sensitive layer. Heat and pressure may then be applied to the light-sensitive layer via the thermoplastic substrate in order to form a film bond between one surface of the light-sensitive layer and the surface of the printed circuit board. Depending upon the tackiness of the light-sensitive layer, heat (e.g., up to about 100° C.) and pressure (e.g., about 10 pounds per square inch up to several hundred pounds per square inch) are used to laminate the light-sensitive layer to the substrate. Thus, high pressure (e.g., several hundred pounds per square inch) and temperature (e.g., up to 100° C.) are often used to laminate when the light-sensitive layer is completely nontacky, whereas very little pressure (e.g., about 10 pounds per square inch) is used, with no externally applied heat being required to laminate, when the light-sensitive layer is highly tacky.

After the light-sensitive layer has been so laminated to the printed circuit board, and while the thermoplastic substrate is still in place over the light-sensitive layer, the light-sensitive layer is exposed imagewise to actinic radiation (through the thermoplastic substrate). When the light-sensitive layer is photocrosslinkable, it is exposed to actinic radiation in a conventional manner in areas which directly overlie the portions of the printed circuit which are to be protected. When the light-sensitive layer is photosolubilizable, it is exposed to actinic radiation in a conventional manner in areas which directly overlie the portions of the printed circuit which are desired to be unprotected.

After exposure of the light-sensitive layer to actinic radiation the thermoplastic substrate is removed from the light-sensitive layer. Such substrate can be removed by simply peeling it away or by washing it away with water or developing solution. The exposed light-sensitive layer is photocrosslinkable, the developing solution removes nonimage areas because the image areas have been rendered insoluble during exposure. When the light-sensitive layer is photosolubilizable, the developing solution removes image areas because such areas have been rendered soluble during exposure. Thus, in each case a printed circuit is obtained which is selectively covered with a protective coating. The portions of the printed circuit which remain uncovered are accordingly adapted to receive further electrical components which are to be connected thereto.

Removal of unexposed portions of negative-acting compositions, and removal of exposed portions of positive-acting compositions, may also be accomplished by simply peeling the thermoplastic substrate away from the printed circuitry when using compositions in which exposed portions and unexposed portions exhibit differing adhesion to the printed circuitry.

When using photocrosslinkable light-sensitive layers, a highly crosslinked, insoluble, heat-resistant, dielectric coating is obtained upon simple exposure thereof to actinic radiation. However, when using photosolubilizable light-sensitive layers containing thermally crosslinkable binders, the nonexposed areas, after development, must be heated in order to render them completely insoluble and highly crosslinked. Generally speaking, such nonexposed areas are heated to at least 125–150° C. in order to render them highly crosslinked. One may, of course, heat such nonexposed areas to much higher temperatures (e.g., 250° C.) to obtain the crosslinking so long as the photosolubilizable composition in such areas becomes highly insoluble before it decomposes.

Conventional developing solutions are used to develop the exposed compositions of the invention. Generally speaking, aqueous alkaline solutions, in which various solvents may be included, are the preferred developing solutions for photosolubilizable compositions and for the preferred photocrosslinkable compositions. Simple solvent developing solutions, or solvent blends, are suitable for use with light-sensitive compositions which have little or no acid functionality.

The following nonlimiting examples serve to illustrate the present invention. Unless otherwise indicated, the term "parts" refers to parts by weight.

EXAMPLE 1

A photocrosslinkable polymeric compound is prepared in accordance with the following procedure. To a one liter resin flask fitted with stirrer, condenser, thermometer and air inlet was added 2-hydroxyethyl acrylate (223.8 grams) and phenotriazine (0.045 grams). The flask contents were heated to 100° C. after which 223.8 grams of styrene/maleic anhydride copolymer (1:1 ratio; average molecular weight of about 1600) were added to the flask incrementally over a period of 1 hour. The reaction was continued at 100° C. for an additional six hours. Air was passed over the surface of the flask contents as the reaction proceeded. The flask contents were cooled and 250 ml. of acetone were added thereto to dilute the flask contents. The acetone solution was then added to a large volume of vigorously agitated water, whereupon the product polymeric compound precipitated from solution, after which it was isolated, washed and dried. The product polymeric compound (292.9 grams) had an average molecular weight of about 2500, an acid equivalent weight of 337, and was of the following formula:

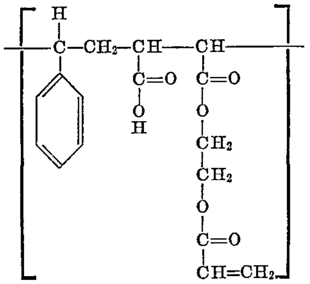

EXAMPLE 2

A light-sensitive composition is prepared, wherein the light-sensitive compound of the continuous phase is photocrosslinkable, using the following ingredients in the amounts shown:

| | Parts |
|---|---|
| "Hycar 1072" elastomer solution (15% solids in methylethylketone) | 22.5 |
| "Hydrin 200" elastomer solution (15% solids in tetrahydrofuran) | 7.5 |
| Polymeric compound of Example 1 | 7.0 |
| Pentaerythritol tetraacrylate | 5.0 |
| Photoinitiator (15% solids in tetrahydrofuran) | 2.2 |
| Colorant ("Sudan III" dye) | 0.02 |

The "Hycar 1072" elastomer solution is commercially available, the elastomer being a carboxylated acrylonitrile/butadiene copolymer having a number average molecular weight of about 30,000 and comprising about 5% acrylic acid, 35% acrylonitrile, and 60% butadiene. The "Hydrin 200" elastomer solution is also commercially available and it comprises an epichlorohydrin/ethylene oxide copolymer. After the "Hydrin 200" elastomer solution is added to, and blended with, the "Hycar 1072" solution, the polymeric compound of Example 1 and the pentaerythritol tetraacrylate monomer are added thereto, followed by the addition of the photoinitiator and colorant. The photoinitiator used in this example was 2,4-bis(trichloromethyl)-6-(p-methoxystyryl)-s-triazine.

The resulting dispersion was coated onto a 1 mil thick polyvinyl alcohol film (which had been coated onto a polyester film carrier sheet) and dried in a 100° C. oven to leave a light-sensitive coating which was 3 mils thick, the light-sensitive coating being bonded to the polyvinyl alcohol film. After the light-sensitive coating has dried, the polyester film carrier sheet is typically stripped off the back side of the polyvinyl alcohol film. One surface of the light-sensitive layer was then laminated to the surface of a printed circuit board, the circuit board being an etched, solder plated, flexible copper circuit laminate commercially available from 3M Company as "LX 6530-20" and having a flexible dielectric core of cured, epoxy saturated, polyester nonwoven web. The lamination of the light-sensitive layer to the printed circuit board was performed with a two roll laminater heated to 160° F. and using an applied pressure of 300 p.s.i.g. The polyvinyl alcohol film remained in place over the light-sensitive layer during the lamination procedure, and the light-sensitive layer became firmly bonded to the uneven surfaces of the flexible circuit board during lamination.

With the polyvinyl alcohol film still in place, the light-sensitive layer is exposed in an imagewise manner (using a negative pattern) through the polyvinyl alcohol film using a 2,000 watt Colite Hydrolight UV source, at a distance of 18 inches, for four minutes. After exposure, the polyvinyl alcohol film was washed away with water and the unexposed portions of the light-sensitive layer were removed with an aqueous alkaline developing solution comprising a blend of equal portions of 0.5% sodium hydroxide solution and isopropanol.

The resulting selectively covered printed circuit board was floated on the surface of a molten solder bath (500° F.) for 5 seconds, the crosslinked cover coating being in direct contact with the molten solder. The crosslinked coating remained flexible and firmly bonded to the printed circuit board. The selectively covered printed circuit board was then immersed in boiling trichloroethylene for one minute after which the covered printed circuit was held in the vapors above the boiling trichloroethylene bath for one minute. The crosslinked coating remained flexible, solvent-resistant and firmly bonded to the printed circuit board.

The dielectric properties of the crosslinked coating prepared in accordance with this example were tested according to the Institute of Printed Circuits Specification IPC-FC-240, FIG. 1 for insulative resistance and were found to be $1 \times 10^{11}$ ohms.

EXAMPLE 3

A light-sensitive composition was prepared using the polymeric compound of Example 1, the ingredients of the entire composition being as follows:

| | Parts |
|---|---|
| "Kraton 1101" elastomer solution (15% solids in toluene) | 53.3 |
| Polymeric compound of Example 1 | 20 |
| Pentaerythritol tetraacrylate | 10 |
| Photoinitiator solution of Example 2 | 5.1 |
| Colorant ("Sudan III" dye) | 0.04 |

The "Kraton 1101" elastomer is commercially available from Shell Chemical Co. and comprises a styrene/butadiene block copolymer. This elastomer is first dissolved in toluene after which the polymeric compound of Example 1, pentaerythritol tetraacrylate monomer, photoinitiator and colorant are added thereto. The resulting mixture (45% solids) is agitated until homogeneous and then coated onto a 1 mil thick polyvinyl alcohol film (which had been coated on a polyester carrier sheet) followed by drying to leave a light-sensitive layer which is 2 mils thick. The polyester carrier sheet is then removed from the back side of the polyvinyl alcohol film.

The light-sensitive layer, with polyvinyl alcohol film in place, was then laminated to the surface of a printed circuit board according to the procedure of Example 2 using 100 p.s.i.g. and 170° F. temperature during the lamination procedure. After imagewise exposure to the light-sensitive layer in accordance with the procedure of Example 2, the polyvinyl alcohol film was washed away and the unexposed portions of the light-sensitive layer were removed using an aqueous alkaline developing solution comprising a blend of 0.5% sodium hydroxide solution (4 parts) and isopropanol (1 part). The remaining coating (crosslinked) was flexible and solvent resistant and it was firmly bonded to the printed circuit board.

The resulting selectively covered printed circuit was floated on the surface of a molten solder bath (500° F.) for 5 seconds, after which the crosslinked coating was still firmly bonded to the printed circuit board and was still flexible and solvent resistant. The crosslinked coating also remained effective as a dielectric barrier.

EXAMPLE 4

A light-sensitive composition (54% solids) was prepared using the ingredients and amounts in Example 3 except that the elastomer solution used was "Gelva RA 784," an acrylic multipolymer commercially available from Monsanto Chemical Company. The composition was coated, laminated, and exposed as described in Example 3 after which unexposed portions of the light-sensitive layer were removed using the developing solution of Example 2.

The resulting crosslinked coating was flexible, heat resistant, and solvent resistant and was effective as a dielectric barrier.

EXAMPLE 5

A light-sensitive composition using a photosolubilizable compound was prepared using the following ingredients:

| | Parts |
|---|---|
| "Hycar 1072" elastomer solution (15% solids in methylethylketone) | 10.6 |
| "Hydrin 200" elastomer solution (20% solids in tetrahydrofuran) | 2.0 |
| "Alnovol 429 K" binder solution (50% solids in methyl isobutyl ketone) | 22.6 |
| Photosolubilizable compound | 4.0 |
| Photoinitiator solution of Example 2 | 0.24 |

After the "Hydrin 200" elastomer solution is added to, and blended with, the "Hycar 1072" solution, the "Alnovol 429 K" binder solution (comprising thermally crosslinkable phenolic resin) and photosolubilizable compound are added thereto, followed by the addition of the photoinitiator. The coating dispersion was 50% solids. The photosolubilizable compound used was the bis(2-tetrahydropyranyl)ether of bisphenol A, having the formula:

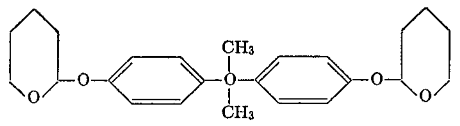

The coating dispersion or mixture was coated onto a 1 mil thick polyvinyl alcohol film (carried on a polyester carrier sheet) and dried at 73° C. for 10 minutes to leave a light-sensitive coating which was 3.5 mils thick, the light-sensitive coating being bonded to the polyvinyl alcohol film. The polyester carrier sheet was then removed from the polyvinyl alcohol film. The light-sensitive layer, with polyvinyl alcohol film in place, was then laminated to the surface of a printed circuit board according to the procedure of Example 2 using 200 p.s.i.g. and 245° F. temperature during the lamination procedure. After imagewise exposure of the light-sensitive layer to actinic radiation for 2.5 minutes (using a positive photomask and a Colite Hydrolite source), the polyvinyl alcohol film was washed away and the exposed portions of the light-sensitive layer were removed using an aqueous alkaline developing solution comprising a 1% sodium hydroxide solution which contained 5% by weight of isopropanol. After drying, the circuit board and the remaining portions of the light-sensitive layer were heated at 500° F. for 5 minutes to thermally crosslink said remaining portions of said light-sensitive layer to an insoluble, heat-resistant state.

The resulting selectively covered printed circuit board was floated on the surface of a molten solder bath (450° F.) for 5 seconds, the crosslinked cover coating being in direct contact with the molten solder. The crosslinked coating remained flexible and firmly bonded to the printed circuit board. The crosslinked coating also remained solvent-resistant and was an effective dielectric barrier.

EXAMPLE 6

A photocrosslinkable compound is prepared in accordance with the following procedure: To a 500 ml. flask fitted with stirrer, condenser, thermometer and air inlet was added allyl alcohol (150 grams). The flask contents were heated to 75° C. after which 75 grams of styrene/maleic anhydride copolymer (1:1 ratio; average molecular weight of about 1600) were added incrementally over a period of 20 minutes. The flask contents were then heated to 94° C. and held there for 6 hours. The flask contents were cooled after which the viscous product was added to a large volume of vigorously agitated water, whereupon the product polymeric compound precipitated and was isolated by filtration. The product compound was washed three times by redispersing it in rapidly agitated water. The product compound had an average molecular weight of about 2000, an acid equivalent weight of 232, and was of the following formula:

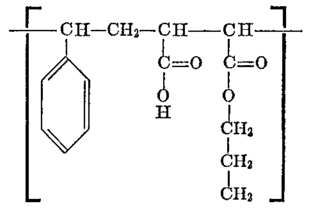

EXAMPLE 7

A light-sensitive composition was prepared using the photocroslinkable polymeric compound of Example 6, the ingredients of the entire composition being as follows:

| | Parts |
|---|---|
| "Hycar 1072" elastomer solution (20% solids in methylethylketone) | 34 |
| "Hydrin 200" elastomer solution (15% solids in tetrahydrofuran) | 12 |
| Polymeric compound of Example 6 | 14 |
| Pentaerythritol tetraacrylate | 10 |
| Photoinitiator solution of Example 2 | 0.66 |
| Colorant ("Sudan III" dye) | 0.03 |

After the "Hydrin 200" elastomer solution is added to, and blended with, the "Hycar 1072" elastomer solution, the polymeric compound of Example 6 and the pentaerythritol tetraacrylate monomer are added thereto, followed by the addition of the photoinitiator and colorant. The resulting dispersion was coated onto a 1 mil thick polyvinyl alcohol film (carried on a po'yester carrier sheet) and dried to leave a light-sensitive coating which was 3.3 mils thick, the light-sensitive coating being bonded to the polyvinyl alcohol film.

The light-sensitive layer, with polyvinyl alocohol film in place, was then laminated to the surface of a printed circuit board according to the procedure of Example 2 using 300 p.s.i.g. and 165° F. (75° C.) temperature during the lamination procedure. After imagewise exposure of the light-sensitive layer to actinic radiation (5 minutes with a 2,000 watt Colite Hydrolite UV source), the polyvinyl alcohol film was washed away and the unexposed portions of the light-sensitive layer were removed using an aqueous alkaline solution comprising a blend of 0.5% sodium hydroxide solution (3 parts) and isopropanol (1 part). The remaining coating (crosslinked) was flexible and solvent resistant and it was firmly bonded to the printed circuit board.

The resulting selectively covered printed circuit was floated on the surface of a molten solder bath (500° F.) for 3 seconds, after which the crosslinked coating was still firmly bonded to the printed circuit board and was still flexible and solvent resistant. The crosslinked coating also remained effective as a dielectric barrier.

EXAMPLE 8

A light-sensitive composition was prepared using the following ingredients, wherein the photocrosslinkable compound is of the nonacid type:

| | Parts |
|---|---|
| "Hycar 1072" elastomer solution (20% solids in methylethylketone) | 36 |
| "Hydrin 200" elastomer solution (15% solids in tetrahydrofuran) | 12 |
| "XD 7156.03" solution (60% solids in vinyl toluene | 14 |
| Pentaerythritol tetraacrylate | 10 |
| Photoinitiator solution of Example 2 | 0.68 |
| Colorant ("Sudan III" dye) | 0.03 |

After the "Hydrin 200" elastomer solution is added to, and blended with, the "Hycar 1072" solution, the "XD 7156.03" solution and the pentaerythritol tetraacrylate are added thereto followed by the addition of the photoinitiator and colorant. The "XD 7156.03" solution is commercially available from Dow Chemical Co. and it comprises 40% by weight vinyl toluene and 60% by weight of the polymeric compound of the following formula:

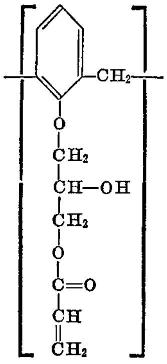

The resulting coating mixture was coated onto a 1 mil polyvinyl alcohol film (carried on a polyester carrier sheet) and dried for 15 minutes at 60° C. and then for 10 minutes at 110° C. to leave a light-sensitive layer which was 3.1 mils thick. The light-sensitive layer, with polyvinyl alcohol film in place, was then laminated to the surface of a printed circuit board according to the procedure of Example 2 using 300 p.s.i.g. and 165° F. (75° C.) temperature during the lamination procedure.

After imagewise exposure of the light-sensitive layer to actinic radiation (4 minutes with a 2,000 watt Colite Hydrolite UV source at 18 inches), the polyvinyl alcohol film was washed away with water and the unexposed portions of the light-sensitive layer were removed using a solvent developing solution comprising a 1:1 blend of trichloroethylene and isopropanol. The remaining crosslinked coating was flexible and solvent resistant and it was firmly bonded to the printed circuit board.

The resulting selectively covered printed circuit was floated on the surface of a molten solder bath (500° F.) for 5 seconds, after which the crosslinked coating was still firmly bonded to the printed circuit board and was still flexible and solvent resistant. The crosslinked coating also remained effective as a dielectric barrier.

What is claimed is:

1. A light-sensitive composition comprising:

(a) a continuous phase comprising light sensitive organic material having one solubility state in relation to a developing media before exposure to light and another solubility state in relation to said developing media after exposure to light, said light-sensitive organic material being soluble in one of said states and insoluble in its other state; and (b) a discontinuous phase comprising at least one finely divided elastomeric organic compound which is incompatible with the continuous phase and is in the form of irregularly shaped rubbery islands throughout said continuous phase and which remains rubbery following exposure of said composition to light and imparts flexibility to coatings of the light sensitive composition.

2. A light-sensitive composition in accordance with claim 1 wherein said light-sensitive organic material comprises photocrosslinkable polymer.

3. A light-sensitive composition in accordance with claim 2 wherein said light-sensitive organic material further comprises a photoinitiator system which is normally nonreactive in said composition but, which upon absorption of actinic radiation, is capable of generating free radicals, said photoinitiator being dispersed throughout said continuous phase.

4. A light-sensitive composition in accordance with claim 1 wherein said light-sensitive organic material comprises a photosolubilizable compound and a thermally-crosslinkable binder.

5. A light sensitive composition comprising:

(a) a continuous phase comprising photocrosslinkable polymer which crosslinks in the presence of free radicals;

(b) a discontinuous phase comprising at least one finely divided, elastomeric, organic compound which is incompatible with the continuous phase in the form of irregularly shaped rubbery islands throughout said continuous phase and which remains rubbery following exposure of said composition to light and imparts flexibility to coatings of the light sensitive composition; and (c) a photoinitiator system which is normally nonreactive in said composition but which, upon absorption of actinic radiation, is capable of generating free radicals, said photoinitiator being dispersed throughout said continuous phase.

6. A light-sensitive composition in accordance with claim 5 wherein said photocrosslinkable polymer is of the following structure:

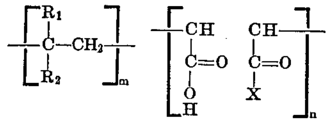

wherein $R_1$ is hydrogen or $CH_3$; $R_2$ is selected from the group consisting of hydrogen, alkyl radicals having 1 to 18 carbon atoms, aryl radicals and substituted aryl radicals; X is a photocrosslinkable moiety; wherein the ratio $n:m$ is in the range of 1:1 to 1:10 and wherein the molecular weight of said photocrosslinkable polymer is in the range of about 750 to about 50,000.

7. A light-sensitive composition in accordance with claim 6 wherein $R_2$ is phenyl and X is selected from the group consisting of $$-O-(CHR_4)_a-O-C(=O)-C(R_3)=CH_2,\quad -O-(CHR_4)_a-NH-C(=O)-C(R_3)=CH_2,$$

and $$-NH-(CHR_4)_a-O-C(=O)-C(R_3)=CH_2,$$

wherein $a$ is 2–4, $R_3$ is hydrogen or methyl, and $R_4$ is hydrogen, hydroxy, or amino.

8. A light-sensitive composition in accordance with claim 5 wherein said continuous phase further comprises at least one polyfunctional photocrosslinkable monomer.

9. A light-sensitive composition in accordance with claim 8 wherein said polyfunctional photocrosslinkable monomer is an acrylate monomer having at least two sites of ethylenic unsaturation.

10. A light-sensitive composition in accordance with claim 5 wherein said discontinuous phase comprises a mixture of at least two rubbery, elastomeric organic compounds.

11. A laminate comprising a layer of the light-sensitive composition of claim 1 firmly bonded to a printed circuit board.

12. A laminate comprising a layer of the light-sensitive composition of claim 5 firmly bonded to a printed circuit board.

13. A laminate article comprising a layer of the light-sensitive composition of claim 1 bonded to a thin, flexible substrate.

14. A laminate article comprising a layer of the light-sensitive composition of claim 5 bonded to a thin, flexible substrate.

References Cited

UNITED STATES PATENTS

| | | | |
|---|---|---|---|
| 3,615,937 | 10/1971 | Collins | 96—115 R |
| 3,669,669 | 6/1972 | Klein et al. | 96—115 R |
| 3,669,662 | 6/1972 | Agnihotry | 96—91 N |
| 3,622,320 | 11/1971 | Allen | 96—115 R |
| 3,467,523 | 9/1969 | Seidel et al. | 96—115 R |
| 3,658,531 | 4/1972 | Kurtz | 96—115 R |
| 3,380,831 | 4/1968 | Cohen et al. | 96—115 R |
| 3,060,025 | 10/1962 | Burg et al. | 96—115 P |

RONALD H. SMITH, Primary Examiner

E. C. KIMLIN, Assistant Examiner

U.S. Cl. X.R.

96—35.1, 115 P

UNITED STATES PATENT OFFICE
CERTIFICATE OF CORRECTION

Patent No. 3,825,430 Dated July 23, 1974

Inventor(s) Kurt A. Kurka

It is certified that error appears in the above-identified patent and that said Letters Patent are hereby corrected as shown below:

Col. 6, line 31, "Uat." should read -- Pat. --.

Col. 6, line 44, "undergoing" should read -- undergo -- .

Col. 8, line 17, should read -- is then developed. When the light-sensitive layer is photocrosslinkable, the developing solution removes -- .

Col. 12, lines 17-25, the formula should be as follows --

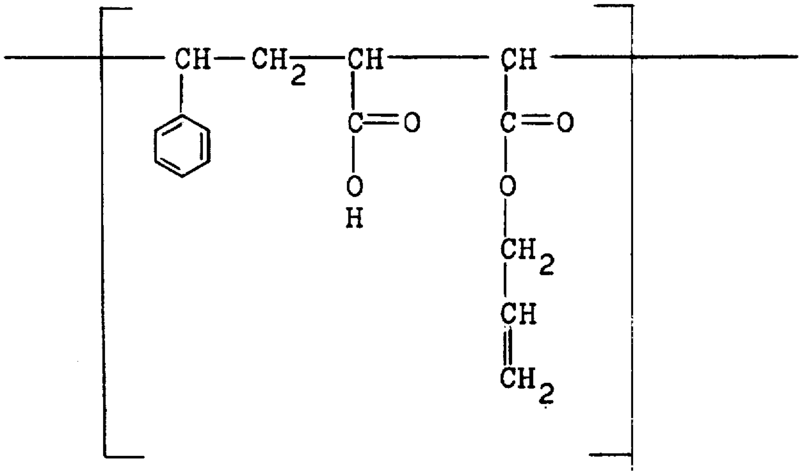

Signed and sealed this 8th day of April 1975.

(SEAL)
Attest:

RUTH C. MASON
Attesting Officer

C. MARSHALL DANN
Commissioner of Patents
and Trademarks